(12) United States Patent
Kuo

(10) Patent No.: US 8,378,408 B2
(45) Date of Patent: *Feb. 19, 2013

(54) MEMORY DEVICES

(75) Inventor: Ming-Chang Kuo, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 214 days.

This patent is subject to a terminal disclaimer.

(21) Appl. No.: 12/730,266

(22) Filed: Mar. 24, 2010

(65) Prior Publication Data

US 2010/0176436 A1 Jul. 15, 2010

Related U.S. Application Data

(63) Continuation of application No. 11/760,646, filed on Jun. 8, 2007, now Pat. No. 7,714,375.

(51) Int. Cl.
*H01L 29/788* (2006.01)

(52) U.S. Cl. .......................... 257/315; 257/316

(58) Field of Classification Search .......... 257/314–320, 257/E21.422, E21.68, E21.681
See application file for complete search history.

(56) References Cited

U.S. PATENT DOCUMENTS

| 5,386,132 A * | 1/1995 | Wong ............................. 257/316 |
| 7,512,012 B2 * | 3/2009 | Kuo ............................ 365/185.26 |
| 2004/0232472 A1 * | 11/2004 | Sakui et al. ..................... 257/314 |

* cited by examiner

*Primary Examiner* — Hung Vu
(74) *Attorney, Agent, or Firm* — Jianq Chyun IP Office

(57) ABSTRACT

A memory device is provided. The memory device includes a first control gate, a second control gate, a plurality of first charge storage elements, a plurality of second charge storage elements and a semiconductor. The plurality of first charge storage elements is beside the first control gate, and each of the first charge storage elements is located on the different side of the first control gate. The plurality of second charge storage elements is beside the second control gate. The semiconductor is located between the first and second control gates.

15 Claims, 13 Drawing Sheets

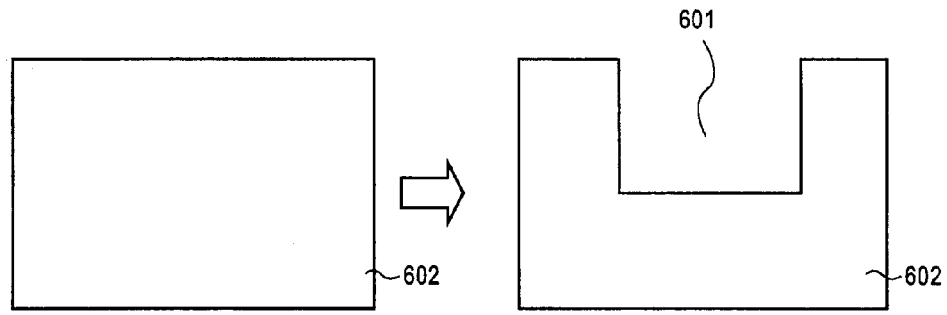
FIG. 6A   FIG. 6B
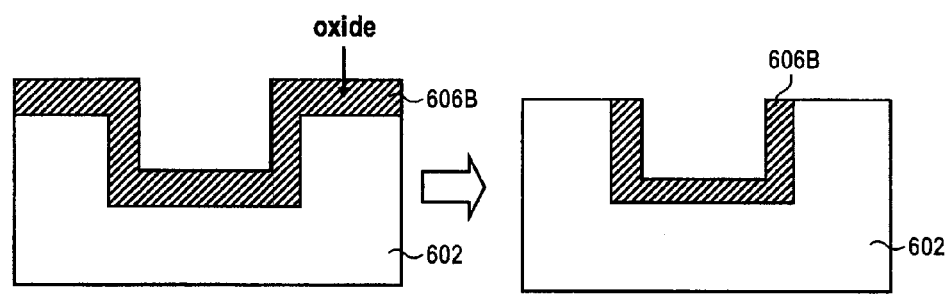
FIG. 6C   FIG. 6D

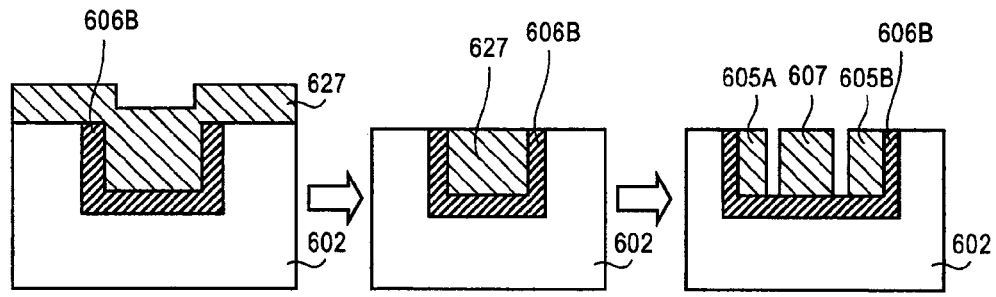
FIG. 6E  FIG. 6F  FIG. 6G
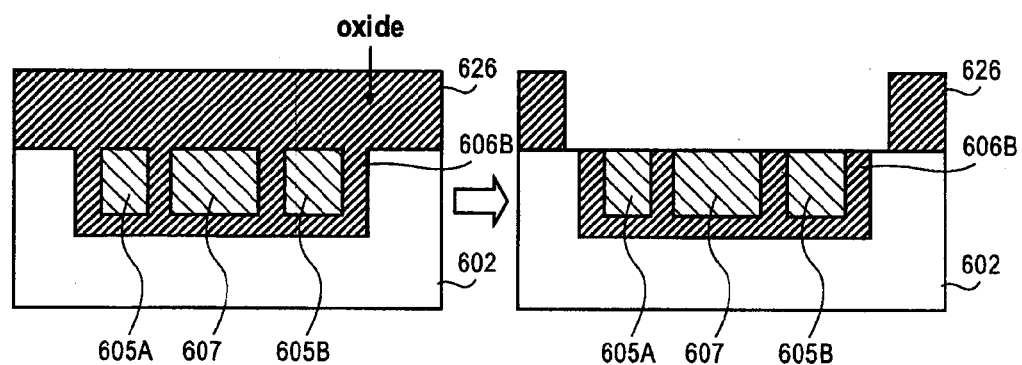
FIG. 6H  FIG. 6I

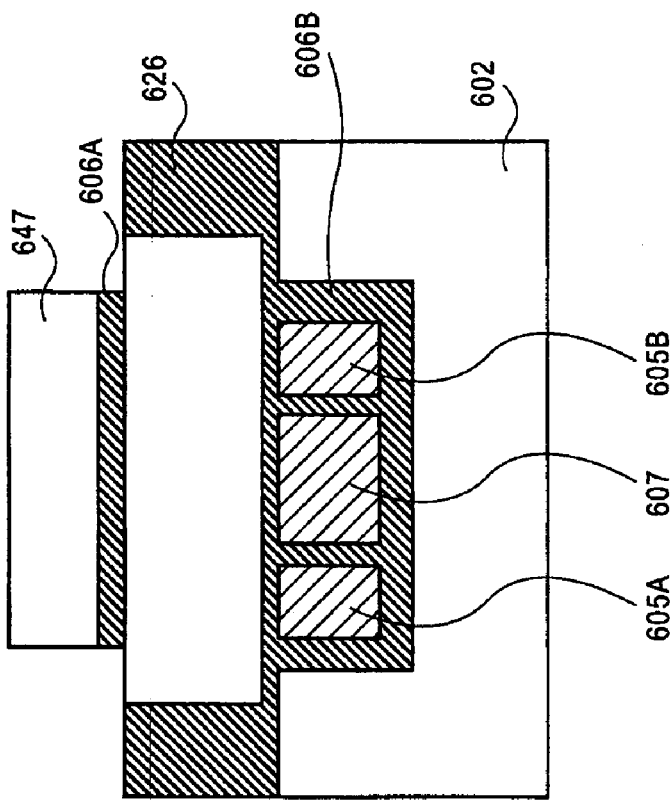
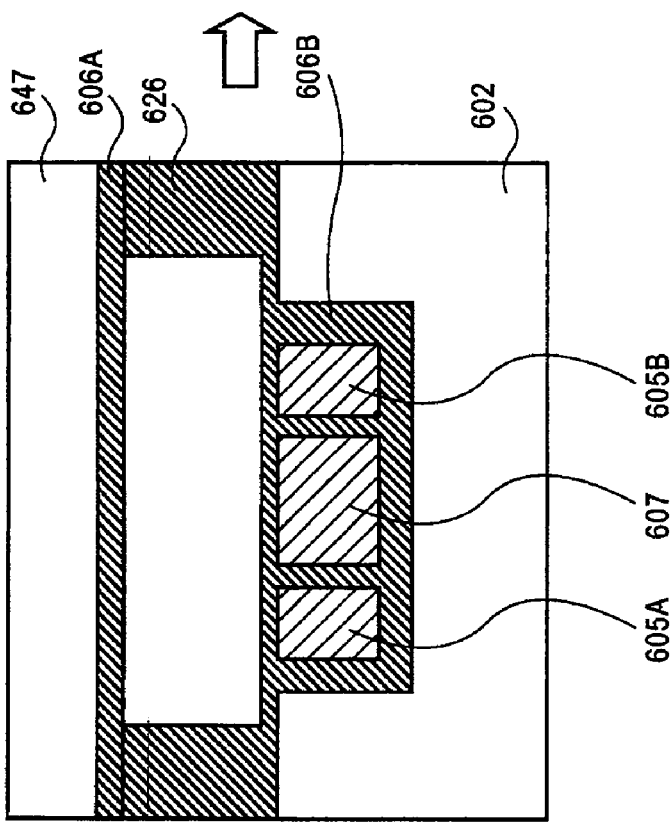

MEMORY DEVICES

CROSS-REFERENCE TO RELATED APPLICATION

This is a continuation application of and claims priority benefit of patent application Ser. No. 11/760,646, filed on Jun. 8, 2007. The entirety of the above-mentioned patent applications is hereby incorporated by reference herein and made a part of this specification.

FIELD

This invention relates generally to memory devices.

BACKGROUND

Memory devices have seen explosive growth with the advancement of electronic applications, such as memory cards, portable electronic devices, cell phones, MP3 players, digital and video cameras, and other consumer electronics. Application requirements for low cost, power consumption and high performance are driving memory design to different architectures. Floating gate structures continue to dominate non-volatile memory technology. These structures typically use polysilicon floating gates as the storage node and are arranged in various memory arrays to achieve architectures such as NAND flash and NOR flash memory. To program and erase the memory cell, electron tunneling methods are used to place or remove electrons from the floating gate.

FIG. 1 shows a prior art flash memory structure 100 having a 1-bit memory cell. The memory structure 100 includes a P-type substrate 102 having N+ dopant diffused areas 103. A tunnel oxide layer 104 is formed on P-type substrate 102 above the N+ dopant areas that function as a drain and source 103A and 103B, respectively. A first polysilicon layer 105 is formed on the tunnel oxide layer 104 that functions as a floating gate (floating gate 105). A dielectric layer 106 is formed on the floating gate layer 105 with a second polysilicon layer 107 formed on the dielectric layer 106 that functions as a control gate (control gate 107). Depending on the voltage applied to the control gate 107, electron tunneling through the tunnel oxide layer 104 will place or remove electrons in the floating gate 105 to store 1-bit of data. This type of prior memory structure only stores 1-bit of data per memory cell. Because of increased density requirements in consumer electronics, there is a need for memory devices to have more than 1-bit of data per memory cell.

SUMMARY

A memory device in accordance with the present invention includes a first control gate, a second control gate, a plurality of first charge storage elements, a plurality of second charge storage elements and a semiconductor. The plurality of first charge storage elements is beside the first control gate, and each of the first charge storage elements is located on the different side of the first control gate. The plurality of second charge storage elements is beside the second control gate. The semiconductor is located between the first and second control gates.

According to an embodiment of the invention, each of the second charge storage elements is located on the different side of the second control gate.

According to an embodiment of the invention, the memory device further includes a channel region located in the semiconductor between the first and second control gates.

According to an embodiment of the invention, the plurality of first charge storage elements are located above the channel region and the plurality of second charge storage elements are located below the channel region.

According to an embodiment of the invention, the memory device further includes a dielectric layer located between the channel region and the plurality of first charge storage elements and the first control gate.

According to an embodiment of the invention, the memory device further includes another dielectric layer located between the channel region and the plurality of second charge storage elements and the second control gate.

According to an embodiment of the invention, the memory device further includes source and drain regions are located in the semiconductor beside the first control gate and the second control gate.

According to an embodiment of the invention, one of the source and regions partially overlaps one of the plurality of first charge storage elements and one of the plurality of second charge storage elements.

According to an embodiment of the invention, the first control gate is opposite to the second control gate.

According to an embodiment of the invention, the plurality of second charge storage elements and the second control gate are embedded in a substrate.

Another memory device in accordance with the present invention includes source and drain regions, a channel region between the source and drain regions, a first conductive line beside a first side of the channel region, a second conductive line beside a second side of the channel region, the second side of the channel region opposite to the first side of the channel region, a first data storage element located beside a first side of the second conductive line, and a second data storage element located beside a second side of the second conductive line, the second side of the second conductive line opposite to the first side of the second conductive line.

According to an embodiment of the invention, the plurality of first data storage elements are located above the channel region and the plurality of second data storage elements are located below the channel region.

According to an embodiment of the invention, the memory device further includes a dielectric layer located between the channel region and the plurality of first data storage elements and the first conductive line.

According to an embodiment of the invention, the memory device further includes another dielectric layer located between the channel region and the plurality of second data storage elements and the second conductive line.

According to an embodiment of the invention, one of the source and regions partially overlaps one of the plurality of first data storage elements and one of the plurality of second data storage elements.

According to an embodiment of the invention, the first conductive line is opposite to the second conductive line.

According to an embodiment of the invention, the plurality of second data storage elements and the second conductive line are embedded in a substrate.

BRIEF DESCRIPTION OF THE DRAWINGS

The accompanying drawings, which are incorporated in and constitute part of this specification, illustrate examples and exemplary embodiments of the invention, and together with the description, serve to explain the principles of the invention. In the drawings.

DETAILED DESCRIPTION

Reference will now be made in detail to the exemplary embodiments of the invention, examples of which are illustrated in the accompanying drawings. Wherever possible, the same reference numbers will be used throughout the drawings to refer to the same. The following examples disclose a memory device that increases memory density by using multi-bits per memory cell. According to one example, a non-volatile memory device includes at least one memory cell. Each memory cell is configured to store multiple bits, wherein each bit is stored in a polysilicon storage layer. In another example, the memory device includes a double gate structure that can store 4-bits per cell. Examples of such non-volatile memory devices include electrically erasable programmable read only memory EEPROM or flash memory.

Figure 1:
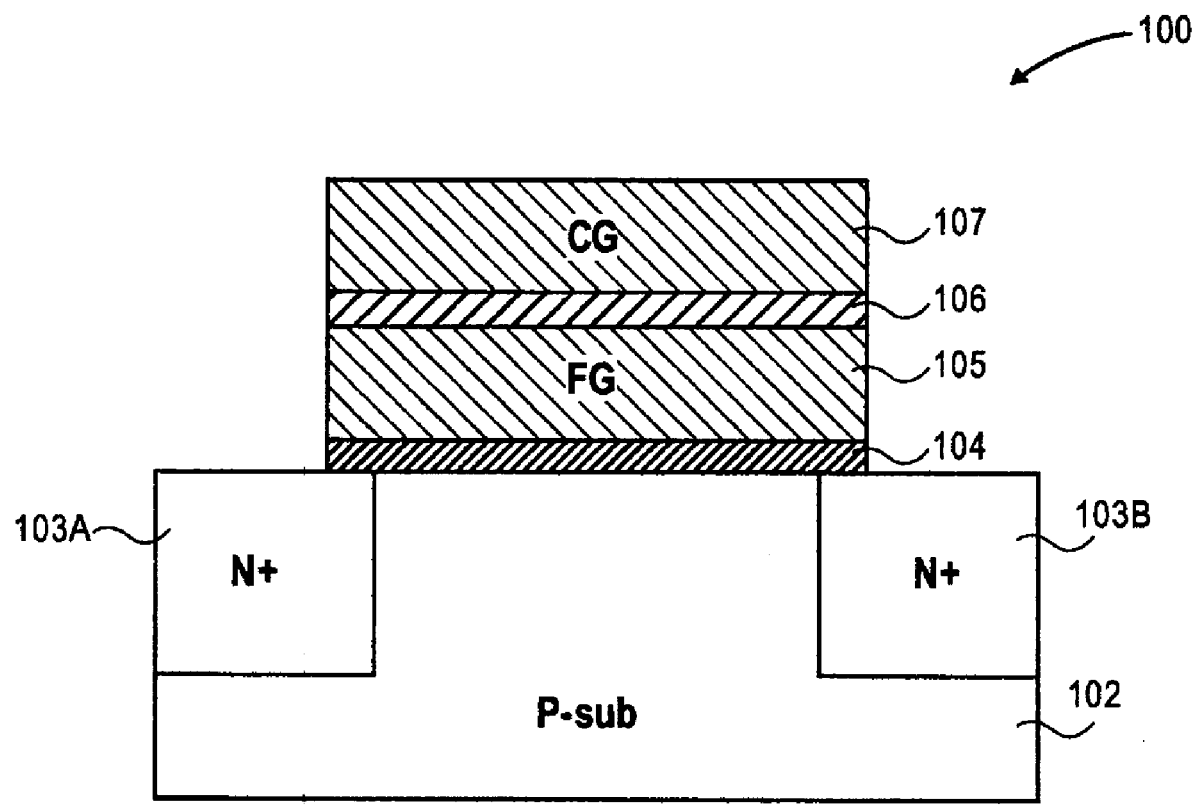
FIG. 1 illustrates a prior art memory structure having a 1-bit memory cell.
Figure 2:
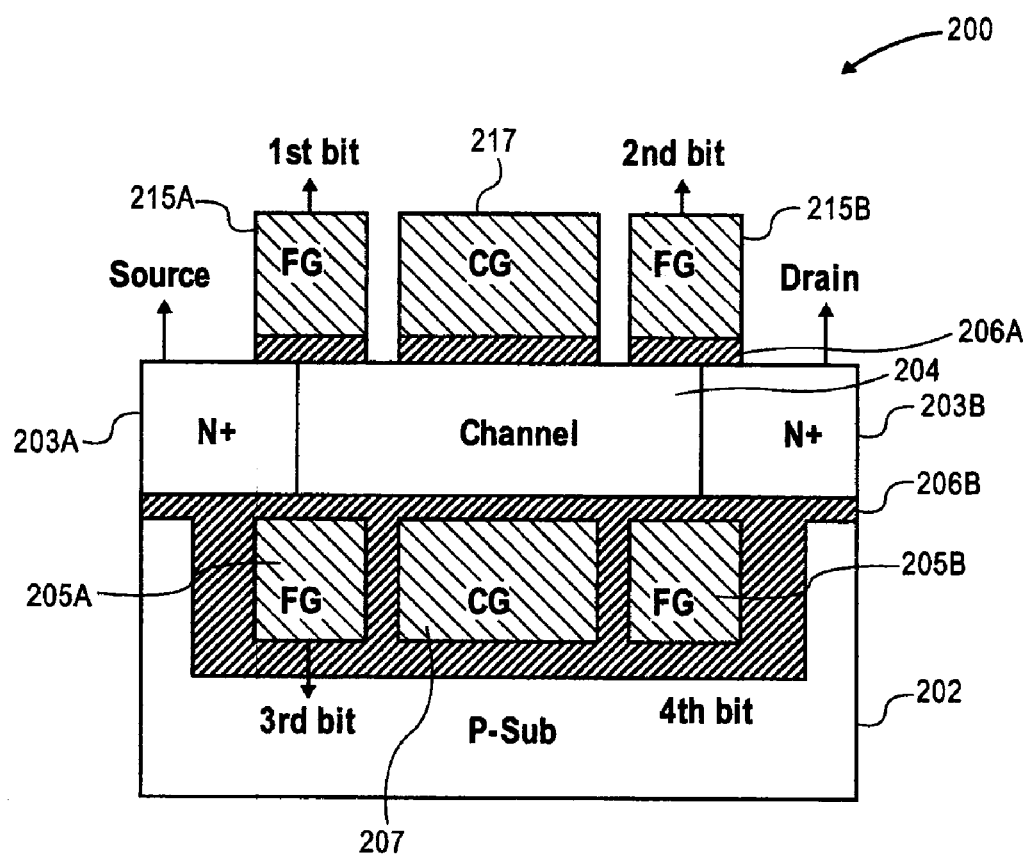
FIG. 2 illustrates one example of a memory structure having a 4-bit memory cell.

FIG. 2 illustrates one example of a memory structure 200 having a 4-bit memory cell. The memory structure 200 includes a P-type substrate 202 with a tunnel channel layer 204, and adjacent N+ type dopant diffused areas formed therein, which functions as a source 203A and a drain 203B. A first dielectric layer 206A is formed on the tunnel channel layer 204 and source 203A and drain 203B. A first and second polysilicon layer are formed on the first dielectric layer 206A, which functions as first and second floating gates 215A and 215B, respectively. The first and second floating gates 215A and 215B can store a respective 1st bit and a 2nd bit. Under the tunnel channel layer 204, a third and fourth polysilicon layers are formed, which functions as third and fourth floating gates 205A and 205B, respectively. The third and second floating gates 205a and 205b can store respective 3rd bit and 4th bit. The polysilicon layer of the each of first through forth floating gates (215A-B and 205A-B) thus acts as a polysilicon charge storage layer. The first and second floating gates (215A-B) are separated from the first control gate 217 by a first dielectric layer 206A. The third and fourth floating gates (205A-B) are separated by the second control gate 207 by the second dielectric layers 206B. Examples of the dielectric layer 206A and 206B can include any oxide layer such as SiO2, which acts as a protection layer.

In operation, for programming and erasing functions, different voltage levels can be applied to the first and second control gates 217 and 207 such that electron tunneling occurs in the tunnel channel layer 204 to place or remove electrons from the first through fourth floating gates 215A-B and 205A-B. In this example, there are 24=16 different combinations of bits that can be stored in the memory cell. The multiple bits are thus controlled by the double control gate structure, which are formed above and below the tunnel channel layer 204 from polysilicon layer. For example, in this double control gate structure, the first control gate 217 controls the data bits stored as the 1st and 2nd bits, and the second control gate 207 controls the data bits stored as the 3rd and 4th bits. By having multi-bits per memory cell, the memory device can maximize data storage area for the memory device, which can lower costs per bit and improve scalability.

Figure 3A:
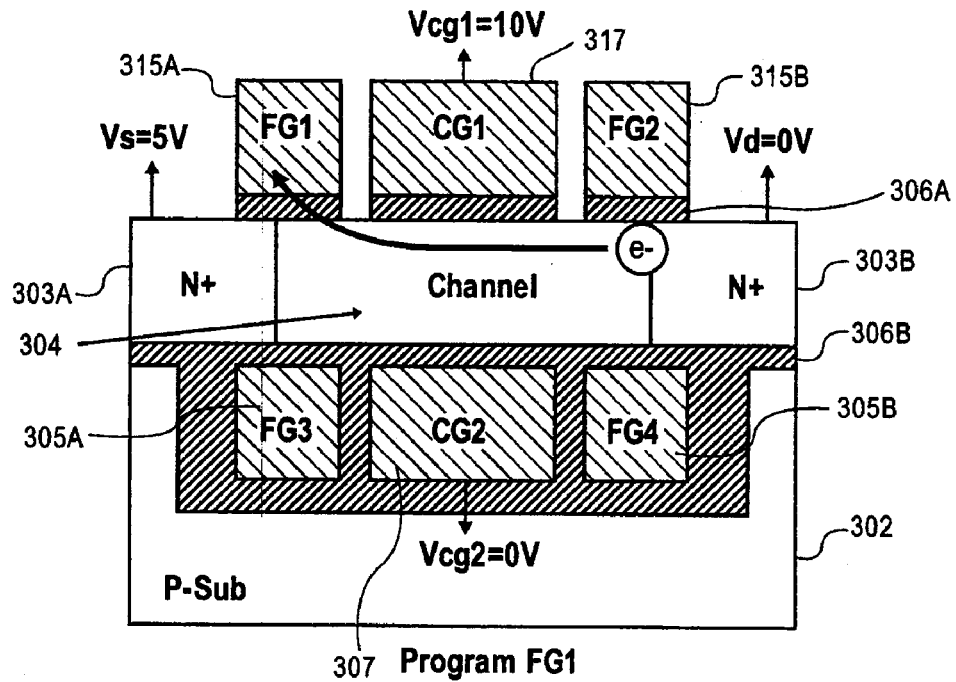
FIGS. 3A-3D illustrate examples of a memory device for programming each bit of a 4-bit memory cell.
Figure 3B:
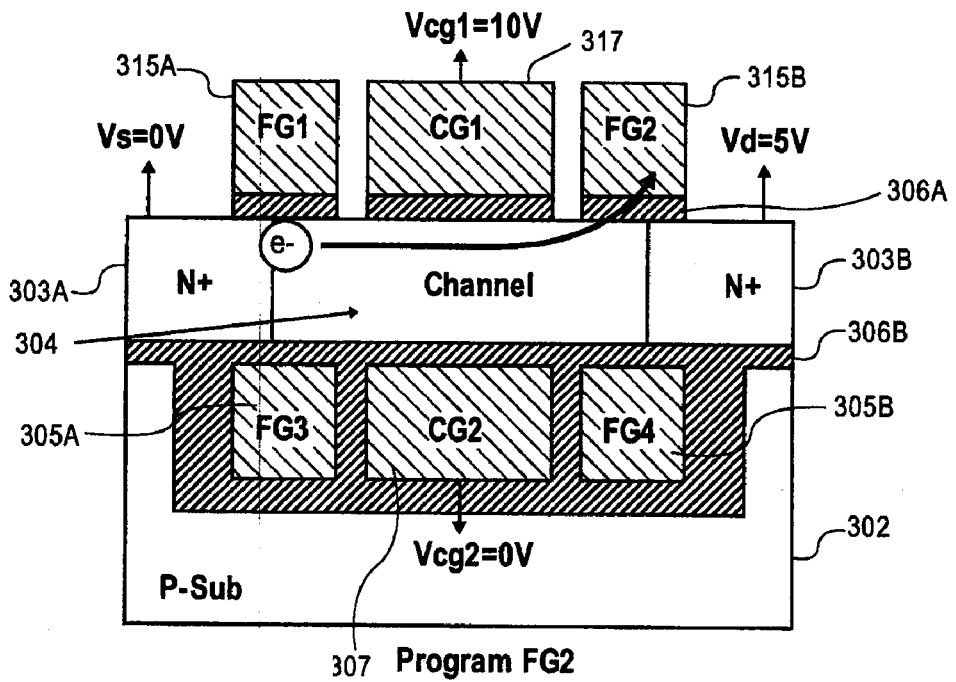

Various operations for the memory device having a 4-bit memory cell will now be described. FIGS. 3A-3D illustrate examples of a memory device for programming each bit of a 4-bit memory cell. Referring to FIG. 3A, in this example, the 1st data bit is programmed in the first floating gate 315A (FG1) by applying a first control gate 317 (CG1) voltage Vcg1=10V and a second control gate 307 (CG2) voltage Vcg2=0V, along with a source 303A voltage Vs=5V and a drain 303B voltage Vd=0V. In this way, electrons ("e−") move from the drain 303B area of the memory structure to the first floating gate 315A (FG1) by channel hot electron tunneling through the tunnel channel 304 region. Referring to FIG. 3B, in this example, the $2^{nd}$ data bit is programmed in the second floating gate 315B (FG2) by applying a first control gate 317 (CG1) voltage Vcg1=10V and a second control gate 307 (CG2) voltage Vcg2=0V, along with a source 303A voltage Vs=0V and a drain 303B voltage Vd=5V. Electrons e− move from the source 303A area to the second floating gate 315B (FG2) by channel hot electron tunneling through the tunnel channel 304 region.

Figure 3C:
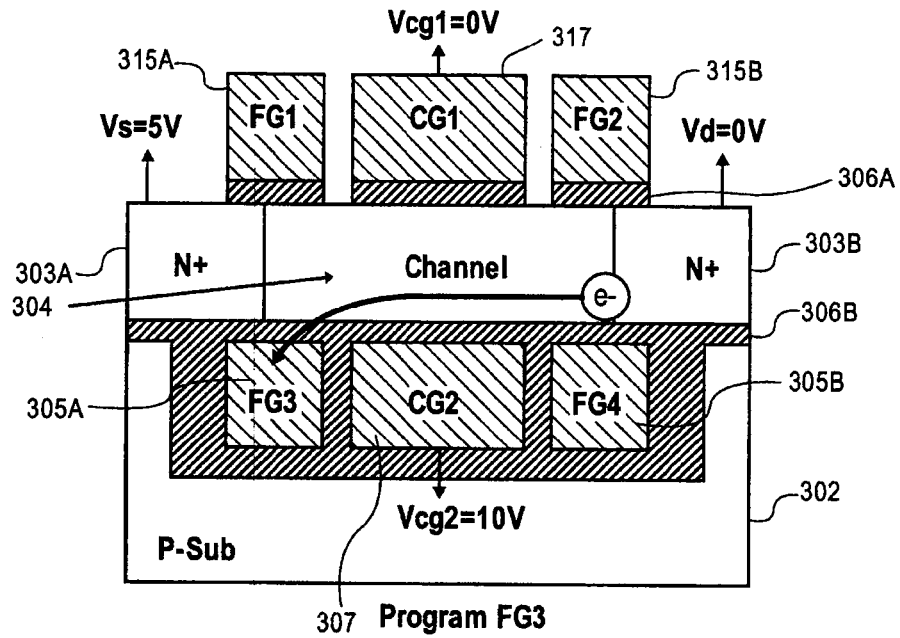
Figure 3D:
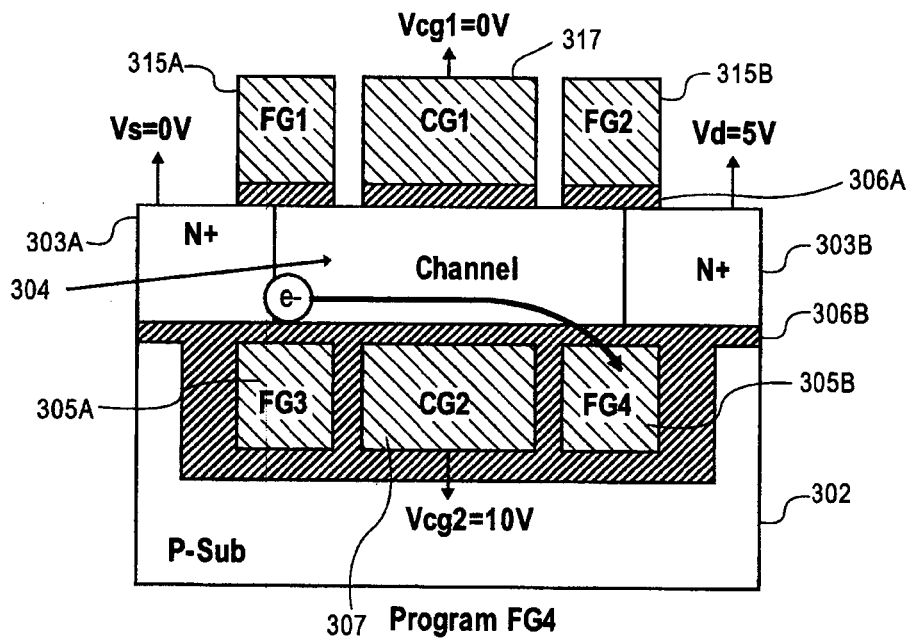

Referring to FIG. 3C, in this example, the 3rd data bit is programmed in the third floating gate 305A (FG3) by applying 0V to the first control gate 317 (CG1) and 10V to the second control gate 307 (CG2), along with a source 303A voltage Vs of 5V and a drain 303B voltage of 0V. Electrons ("e−") move from the drain 303B area of the memory structure to the third floating gate 305A (FG3) by channel hot electron tunneling through tunnel channel 304 region. Referring to FIG. 3D, in this example, the 4th data bit is programmed in the fourth floating gate 305B (FG4) by applying 0V the first control gate 317 (CG1) and 10V to the second control gate 307 (CG2), along with a source voltage Vs 303A of 0V and a drain voltage Vd 303B of 5V. Electrons e− move from the source 303A area to the fourth floating gate 305B (FG4) by channel hot electron tunneling through the tunnel channel 304 region.

Figure 4A:
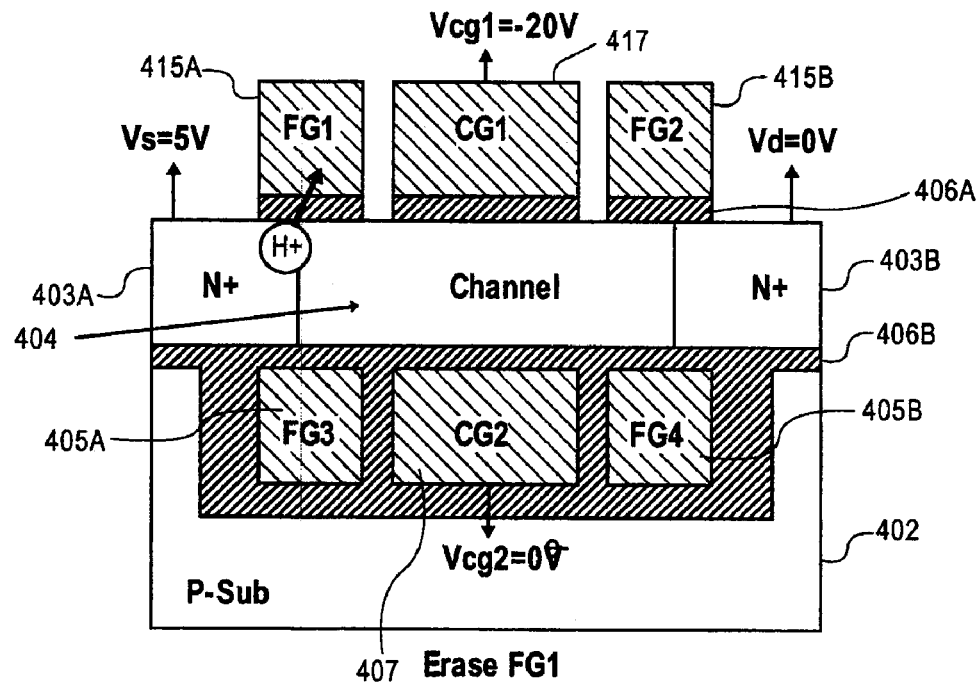
FIGS. 4A-4D illustrate examples of a memory device for erasing each bit of a 4-bit memory cell.
Figure 4B:
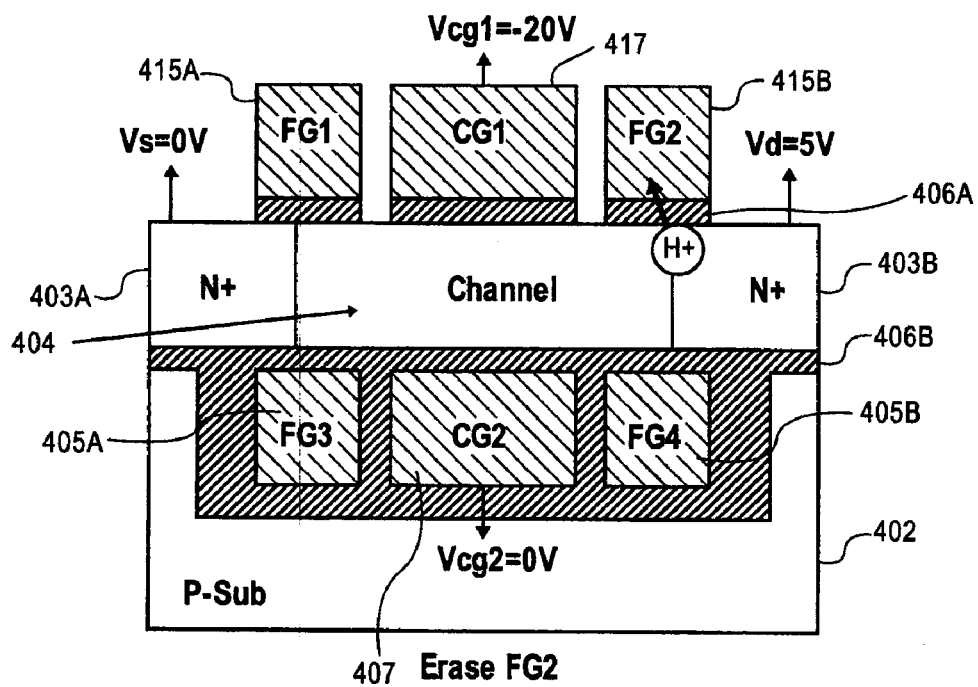

FIGS. 4A-4D illustrate examples of a memory device for erasing each bit of a 4-bit memory cell. Referring to FIG. 4A, in this example, the 1st data bit is erased in the first floating gate 415A (FG1) by applying a first control gate 417 (CG1) voltage Vcg1=−20V and a second control gate 407 (CG2) voltage Vcg2=0V, along with a source 403A voltage Vs=5V and a drain 403B voltage Vd=0V. In this way, holes ("H+") move from the source 403A area of the memory structure to the first floating gate 415A (FG1) by band to band hot hole tunneling through the tunnel channel 404 region. The holes H+ remove electron e− charges from the first floating gate 415A in order to erase the 1st data bit. Referring to FIG. 4B, in this example, the 2nd data bit is erased in the second floating gate 415B (FG2) by applying a first control gate 417 (CG1) voltage Vcg1=−20V and a second control gate 407 (CG2) voltage Vcg2=0V, along with a source 403A voltage Vs=0V and a drain 403B voltage Vd=5V. Holes ("H+") then move from the drain 403B area of the memory structure to the second floating gate 415B (FG2) by band to band hot hole tunneling through the tunnel channel 404 region. The holes H+ remove electron e− charges from the second floating gate 415B in order to erase the 2nd data bit.

Figure 4C:
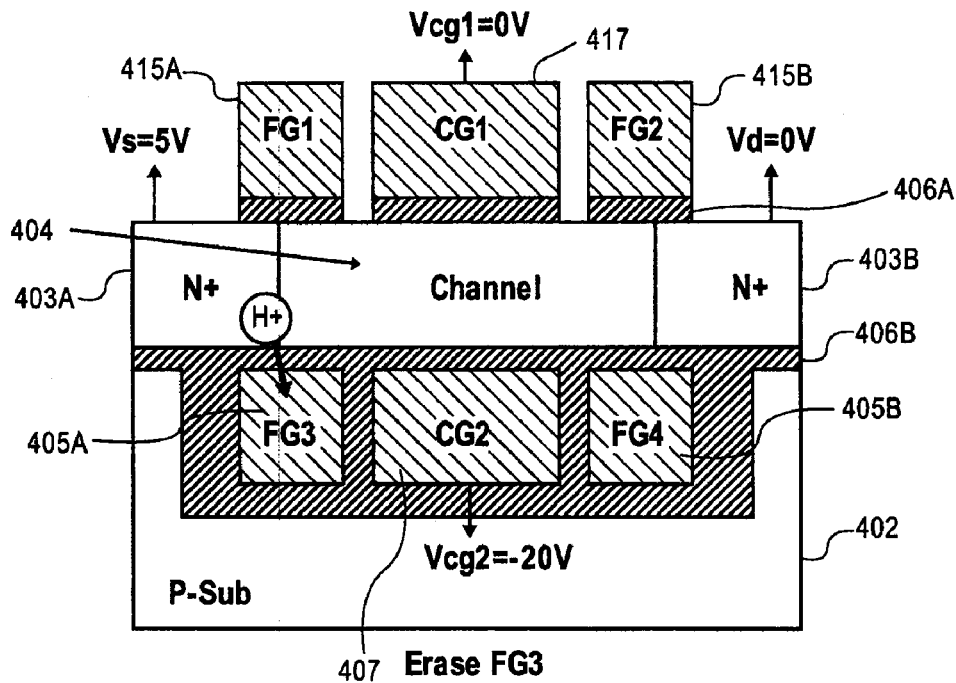
Figure 4D:
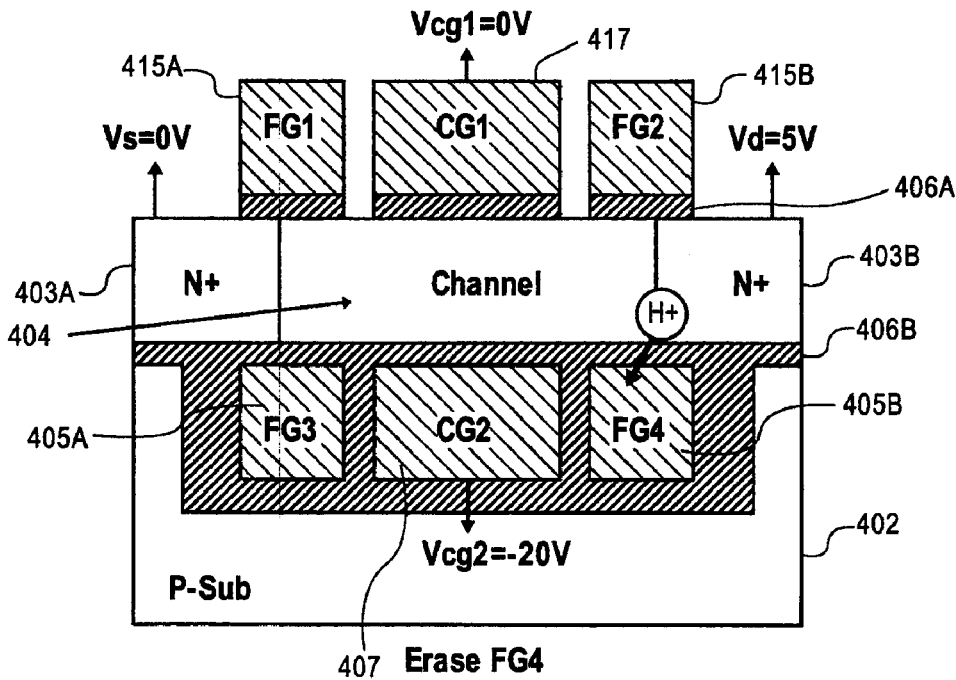

Referring to FIG. 4C, in this example, the 3rd data bit is erased in the third floating gate 405A (FG3) by applying a first control gate 417 (CG1) voltage Vcg1=0V and a second control gate 407 (CG2) voltage Vcg2=−20V, along with a source 403A voltage Vs=5V and a drain 403B voltage Vd=0V. In this way, holes ("H+") move from the source 403A area of the memory structure to the third floating gate 405A (FG3) by band to band hot hole tunneling through the tunnel channel 404 region. The holes H+ remove electron e− charges from the third floating gate 405A in order to erase the 3rd data bit. Referring to FIG. 4D, in this example, the 4th data bit is erased in the fourth floating gate 405B (FG4) by applying a first control gate 417 (CG1) voltage Vcg1=0V and a second control gate 407 (CG2) voltage Vcg2=−20V, along with a source 403A voltage Vs=0V and a drain 403B voltage Vd=5V. Holes ("H+") then move from the drain 403B area of the memory structure to the fourth floating gate 405B (FG4) by band to band hot hole tunneling through the tunnel channel 404 region. The holes H+ remove electron e− charges from the fourth floating gate 405B in order to erase the 4th data bit.

Figure 5A:
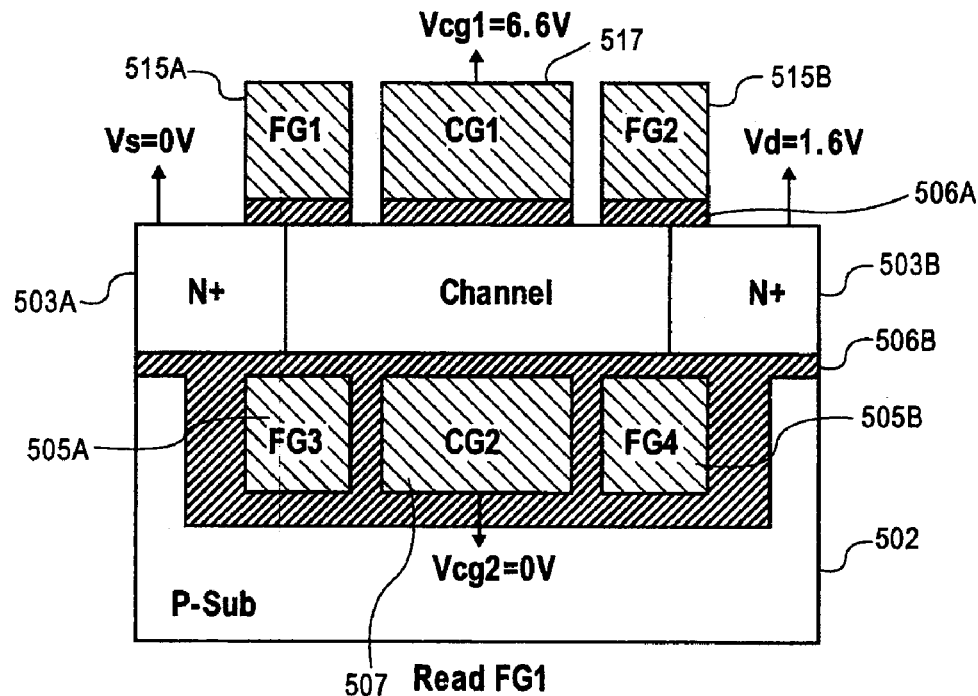
FIGS. 5A-5D illustrate examples of a memory device for reading each bit of a 4-bit memory cell.
Figure 5B:
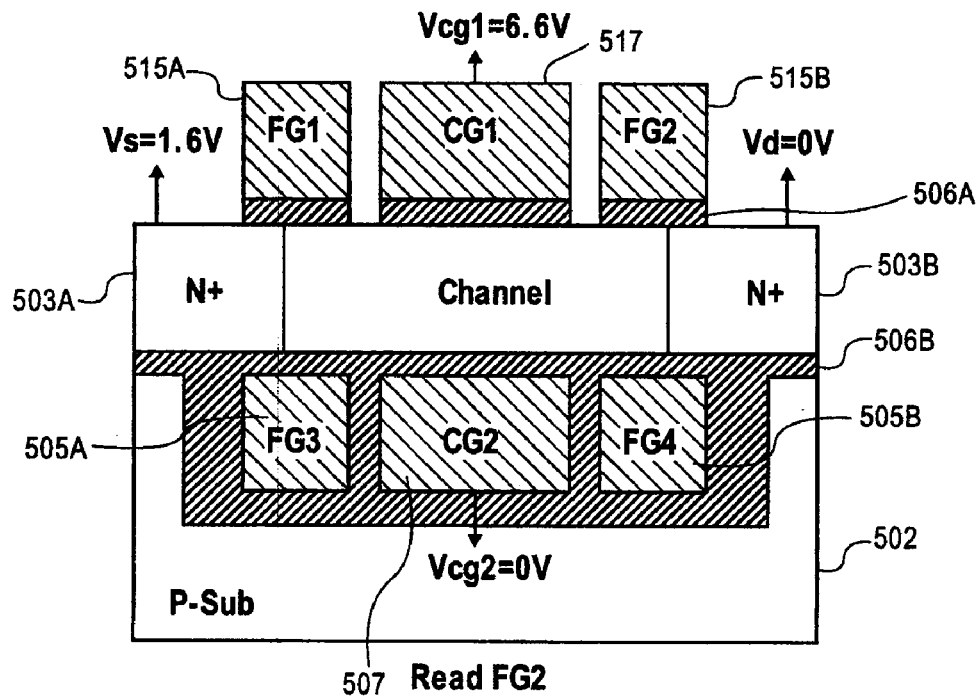

FIGS. 5A-5D illustrate examples of a memory device for reading each bit of a 4-bit memory cell. Referring to FIG. 5A, in this example, the 1st data bit stored in the first floating gate 515A (FG1) is read by applying a first control gate 517 (CG1) voltage Vcg1=6.6V and a second control gate 507 (CG2) voltage Vcg2=0V, along with a source 503A voltage Vs=0V and a drain 503B voltage Vd=1.6V. In this way, the data stored in the 1st data bit of the first floating gate 515A can be sensed or read from a bit line connected to the first floating gate 515A (FG1). Referring to FIG. 5B, in this example, the 2nd data bit stored in the second floating gate 515B (FG2) is read by applying a first control gate 517 (CG1) voltage Vcg1=6.6V and a second control gate 507 (CG2) voltage Vcg2=0V, along with a source 503A voltage Vs=1.6V and a drain 503B voltage Vd=0V. The data stored in the 2nd data bit of the second floating gate 515B can be sensed or read from a bit line connected to the second floating gate 515B (FG2).

Figure 5C:
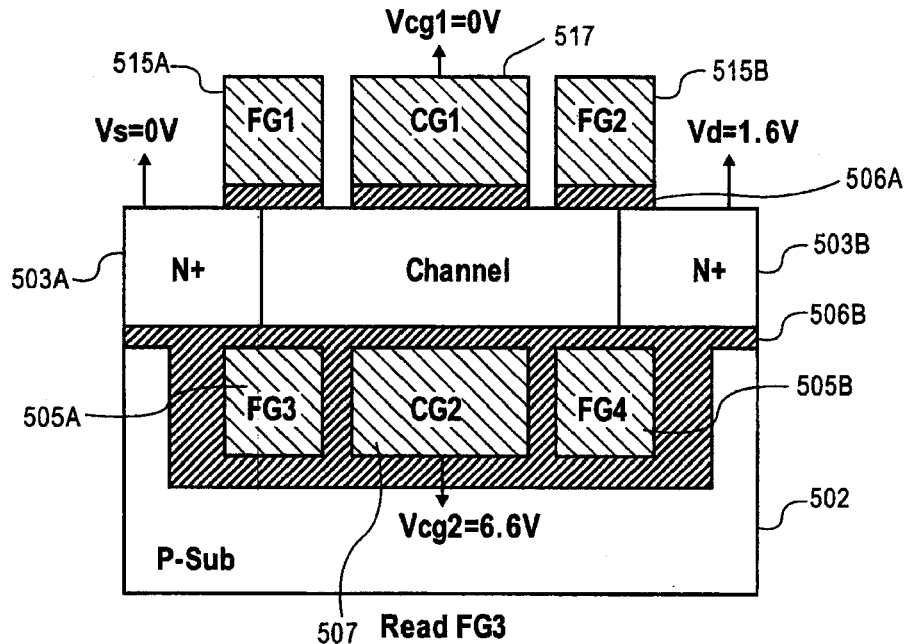
Figure 5D:
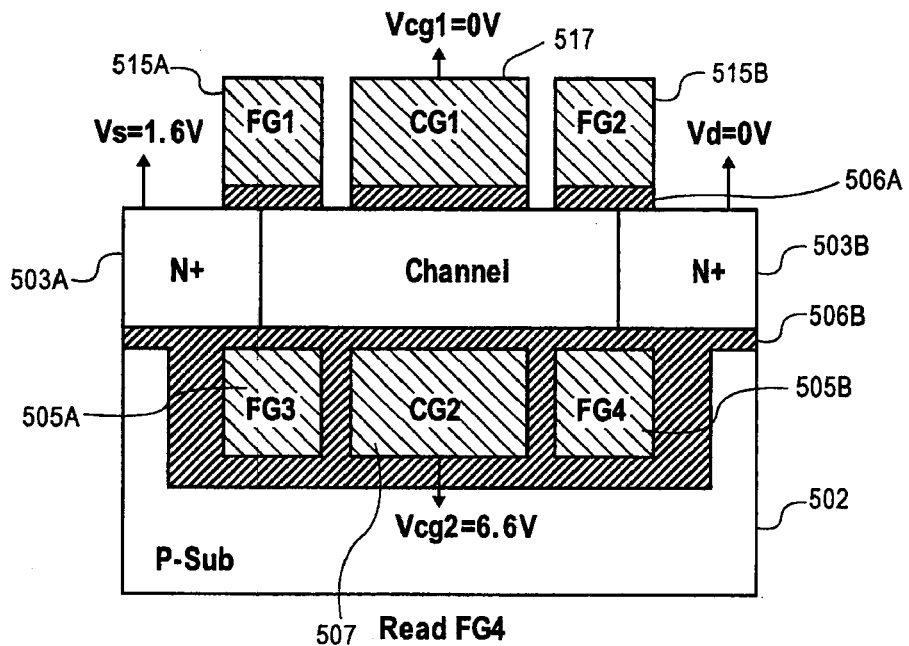

Referring to FIG. 5C, in this example, the 3rd data bit stored in the third floating gate 505A (FG3) is read by applying a first control gate 517 (CG1) voltage Vcg1=0V and a second control gate 507 (CG2) voltage Vcg2=6.6V, along with a source 503A voltage Vs=0V and a drain 503B voltage Vd=1.6V. In this way, the data stored in the 3rd data bit of the third floating gate 505A can be sensed or read from a bit line connected to the third floating gate 505A (FG3). Referring to FIG. 5D, in this example, the 4th data bit stored in the fourth floating gate 505B (FG4) is read by applying a first control gate 517 (CG1) voltage Vcg1=0V and a second control gate 507 (CG2) voltage Vcg2=6.6V, along with a source 503A voltage Vs=1.6V and a drain 503B voltage Vd=0V. The data stored in the 4th data bit of the fourth floating gate 505B can be sensed or read from a bit line connected to the fourth floating gate 505B (FG4).

For the above examples of FIGS. 3A-3D, 4A-4D, and 5A-5D, a non-volatile memory can include millions of memory cells arranged in arrays and blocks, along with word lines to access rows of memory cells and bit lines to access the floating and control gates during the program, erase, and read operations. Furthermore, other circuitry and logic (not shown) can be implemented with the above described memory structure to perform such operations.

The process of making a non-volatile memory with multi-bits will now be described. FIGS. 6A-6B illustrate one example of a process method for making a memory device having a 4-bit memory cell. Referring to FIG. 6A, a substrate 602 is provided, which can be a silicon Si substrate. The substrate 602 is etched such that the substrate 602 defines a cavity 601 shown in FIG. 6B. Next, referring to FIG. 6C, an oxide layer 606B is deposited over the substrate 602 and cavity 601. Then, portions of the oxide layer 606B are removed by using a chemical mechanical polish technique such that the oxide layer 606B is formed along the surface of the substrate 602 defining the cavity 601 as shown in FIG. 6D.

Referring to FIG. 6E, a polysilicon layer 627 is formed over the oxide layer 606b and substrate 602. The polysilicon layer 627 is flattened or smoothed by a chemical mechanical polish process as shown in FIG. 6F. Next, referring to FIG. 6G, the polysilicon layer 627 is etched to form three separate areas of polysilicon, which are identified as 605A, 607, and 605B and will eventually form a bottom pair of floating gates and a bottom control gates. Referring to FIG. 6H, an oxide layer 626 is formed over the three separate areas of polysilicon 605A, 607, and 605B where the oxide layer 626 forms in between areas 607 and 605A and 607 and 605B. The oxide layer 626 is then etched to the polysilicon areas 605A, 607, and 605B, leaving sidewalls as shown in FIG. 6I.

Figure 6J:
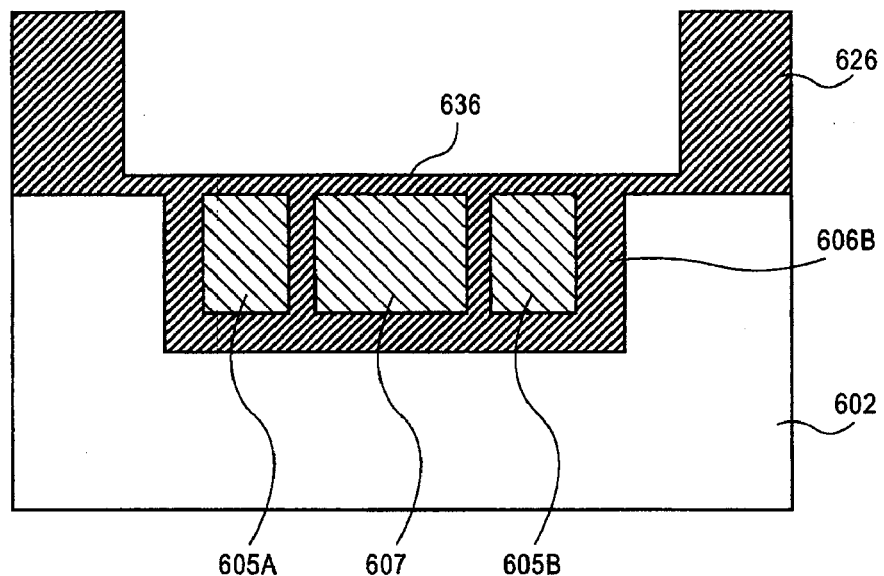
FIGS. 6A-6O illustrate one example of a process method for making a memory device having a 4-bit memory cell.
Figure 6K:
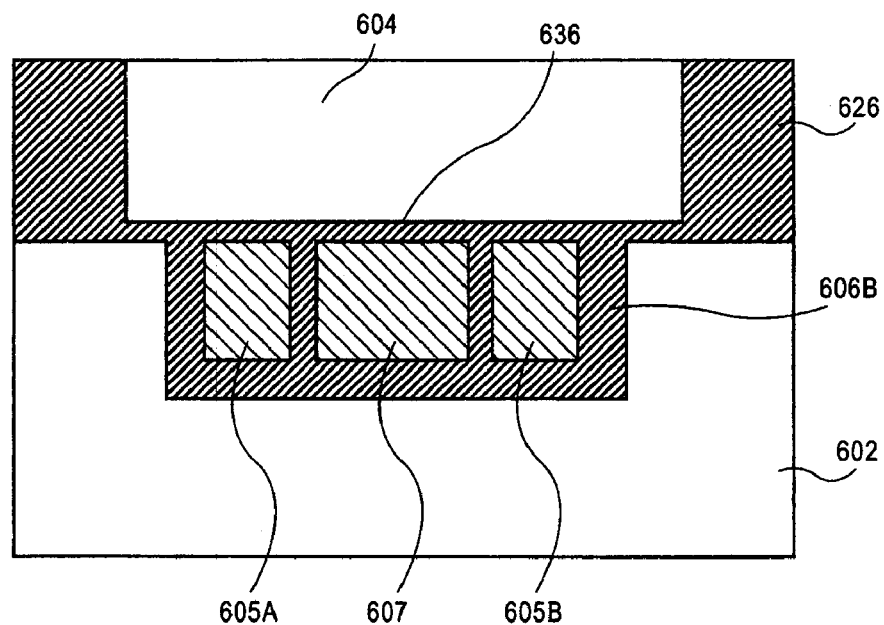
Figure 6N:
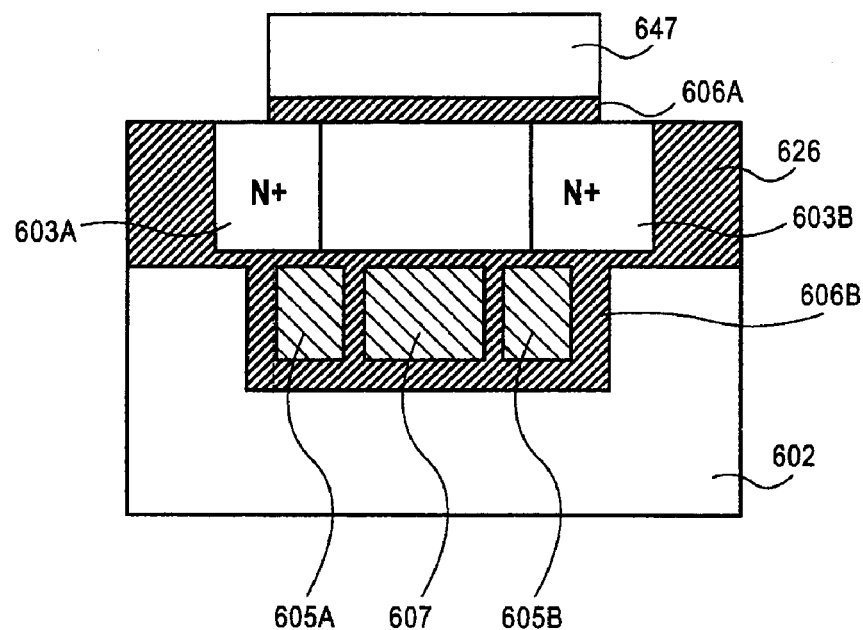
Figure 6O:
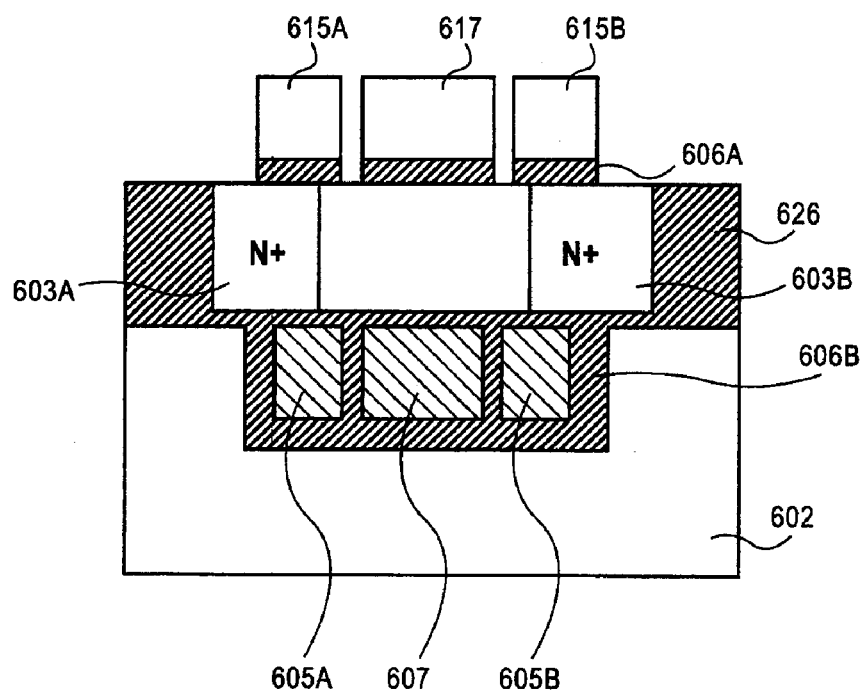

Referring to FIG. 6J, an oxide layer 636 is formed in between oxide layer 626 over the polysilicon layer areas 605A, 607, and 605B. Next, a silicon layer 604 is grown on the oxide layer 636 using an epitaxial lateral overgrowth process as shown in FIG. 6K. The silicon layer 604 is a crystalline material, which can form a tunnel channel region for the memory device. Referring to FIG. 6L, an oxide layer 606A is formed over the silicon layer 604 and oxide layer 626 and a polysilicon layer 647 is formed over the oxide layer 606A. Both the lateral edges of the oxide layer 606A and polysilicon layer 647 are then etched as shown in FIG. 6M. Next, material such as N+ dopants are diffused into the silicon layer 604 by ion implantation to form the source 603A area and drain 603B area as shown in FIG. 6N. Referring to FIG. 6O, the polysilicon layer 647 and oxide layer 606A are etched to form the memory device. This memory device includes a top and bottom control gate 617 (CG1) and 607 (CG2), respectively, with top first and second floating gates 615A-B (FG1 and FG2) and bottom third and fourth floating gates 605A-B (FG3 and FG4). Separating the top gates is a first oxide layer 606A and separating the bottom gates is a second oxide layer 606B. Between the top and bottom gates is the tunnel channel 604 area having a source 603A and drain 603B areas adjacent to it. This memory device can perform the operations as described in FIGS. 3A-3D, 4A-4D, and 5A-5D.

Thus, a non-volatile memory with a multi-bit memory cell and a method for fabricating the same have been described. The above examples disclose a double control gate structure (top and bottom control gates) to control data bits stored in the polysilicon storage layers of the first, second, third, and fourth floating gates. The above examples, however, can be modified such that the polysilicon layer can be subdivided into any number of sections to provide additional data bit storage areas, all of which made from the polysilicon layer. In the foregoing specification, the invention has been described with reference to specific examples and embodiments. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A memory device, comprising:
 a first control gate;
 a plurality of first charge storage elements beside the first control gate, wherein each of the first charge storage elements is located on a different side of the first control gate, and not located in a substrate;
 a second control gate;
 a plurality of second charge storage elements beside the second control gate, wherein the plurality of second charge storage elements and the second control gate are embedded in the substrate; and
 a semiconductor located between the first and second control gates.

2. The memory device of claim 1, wherein each of the second charge storage elements is located on the different side of the second control gate.

3. The memory device of claim 1, further comprising a channel region located in the semiconductor between the first and second control gates.

4. The memory device of claim 3, wherein the plurality of first charge storage elements are located above the channel region and the plurality of second charge storage elements are located below the channel region.

5. The memory device of claim 3, further comprising a dielectric layer located between the channel region and the plurality of first charge storage elements and the first control gate.

6. The memory device of claim 3, further comprising a dielectric layer located between the channel region and the plurality of second charge storage elements and the second control gate.

7. The memory device of claim 1, further comprising source and drain regions are located in the semiconductor beside the first control gate and the second control gate.

8. The memory device of claim 1, wherein one of the source and drain regions partially overlaps one of the plurality of first charge storage elements and one of the plurality of second charge storage elements.

9. The memory device of claim 1, wherein the first control gate is opposite to the second control gate.

10. A memory device, comprising:
   source and drain regions;
   a channel region between the source and drain regions;
   a first conductive line beside a first side of the channel region;
   a second conductive line beside a second side of the channel region, the second side of the channel region opposite to the first side of the channel region;
   a first data storage element located beside a first side of the second conductive line, not located in a substrate; and
   a second data storage element located beside a second side of the second conductive line, the second side of the second conductive line opposite to the first side of the second conductive line, wherein the plurality of second data storage elements and the second conductive line are embedded in the substrate.

11. The memory device of claim 10, wherein the plurality of first data storage elements are located above the channel region and the plurality of second data storage elements are located below the channel region.

12. The memory device of claim 10, further comprising a dielectric layer located between the channel region and the plurality of first data storage elements and the first conductive line.

13. The memory device of claim 10, further comprising a dielectric layer located between the channel region and the plurality of second data storage elements and the second conductive line.

14. The memory device of claim 10, wherein one of the source and drain regions partially overlaps one of the plurality of first data storage elements and one of the plurality of second data storage elements.

15. The memory device of claim 10, wherein the first conductive line is opposite to the second conductive line.

* * * * *